(12) United States Patent
Zhang et al.

(10) Patent No.: US 10,600,688 B2
(45) Date of Patent: Mar. 24, 2020

(54) METHODS OF PRODUCING SELF-ALIGNED VIAS

(71) Applicant: Micromaterials LLC, Wilmington, DE (US)

(72) Inventors: Ying Zhang, Santa Clara, CA (US); Regina Freed, Los Altos, CA (US); Nitin K. Ingle, Santa Clara, CA (US); Ho-yung David Hwang, Cupertino, CA (US); Uday Mitra, Cupertino, CA (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/116,181

(22) Filed: Aug. 29, 2018

(65) Prior Publication Data
US 2019/0074219 A1    Mar. 7, 2019

Related U.S. Application Data

(60) Provisional application No. 62/555,041, filed on Sep. 6, 2017.

(51) Int. Cl.
*H01L 21/768* (2006.01)
*H01L 21/02* (2006.01)
(Continued)

(52) U.S. Cl.
CPC .... *H01L 21/76897* (2013.01); *H01L 21/0217* (2013.01); *H01L 21/02178* (2013.01);
(Continued)

(58) Field of Classification Search
CPC ......... H01L 21/02244; H01L 21/76871; H01L 21/76801; H01L 21/76808;
(Continued)

(56) References Cited

U.S. PATENT DOCUMENTS

| 4,671,970 A | 6/1987 | Keiser et al. |
| 5,824,597 A | 10/1998 | Hong |

(Continued)

FOREIGN PATENT DOCUMENTS

| JP | 2008108757 A | 5/2008 |
| JP | 2011060803 A | 3/2011 |

(Continued)

OTHER PUBLICATIONS

PCT International Search Report and Written Opinion in PCT/US2017/037141 dated Aug. 31, 2017, 11 pages.
(Continued)

*Primary Examiner* — Savitri Mulpuri
(74) *Attorney, Agent, or Firm* — Servilla Whitney LLC

(57) ABSTRACT

Methods and apparatus to form fully self-aligned vias are described. A seed gapfill layer is formed on a recessed first insulating layers positioned between first conductive lines. Pillars are formed from the seed gapfill layer and a second insulating layer is deposited in the gaps between pillars. The pillars are removed and a third insulating layer is deposited in the gaps in the second insulating layer to form an overburden of third insulating layer. A portion of the overburden of the third insulating layer is removed to expose the first conductive lines and form vias.

17 Claims, 8 Drawing Sheets

(51) Int. Cl.
  *H01L 21/311* (2006.01)
  *H01L 21/3105* (2006.01)
  *H01L 23/532* (2006.01)
  *H01L 23/522* (2006.01)
  *H01L 21/321* (2006.01)

(52) U.S. Cl.
  CPC .... H01L 21/02244 (2013.01); H01L 21/7685 (2013.01); H01L 21/76801 (2013.01); H01L 21/76808 (2013.01); H01L 21/76837 (2013.01); H01L 21/76846 (2013.01); H01L 21/76871 (2013.01); H01L 21/76877 (2013.01); H01L 21/76888 (2013.01); *H01L 21/0228* (2013.01); *H01L 21/31053* (2013.01); *H01L 21/31111* (2013.01); *H01L 21/31116* (2013.01); *H01L 21/31144* (2013.01); *H01L 21/3212* (2013.01); *H01L 21/7684* (2013.01); *H01L 21/76834* (2013.01); *H01L 21/76849* (2013.01); *H01L 21/76885* (2013.01); *H01L 23/5226* (2013.01); *H01L 23/53238* (2013.01); *H01L 2221/1026* (2013.01)

(58) Field of Classification Search
  CPC ......... H01L 21/31116; H01L 21/76834; H01L 21/31053; H01L 23/53238; H01L 23/5226; H01L 21/0228; H01L 21/7684; H01L 21/3212; H01L 21/76885; H01L 21/76849; H01L 2221/1026; H01L 21/31111; H01L 21/31144; H01L 21/76897; H01L 21/76877; H01L 21/76837; H01L 21/7685; H01L 21/76846; H01L 21/02178
  See application file for complete search history.

(56) References Cited

U.S. PATENT DOCUMENTS

| | | | |
|---|---|---|---|
| 6,130,151 A | 10/2000 | Lin et al. | |
| 6,143,653 A | 11/2000 | Tsai et al. | |
| 6,528,884 B1 | 3/2003 | Lopatin et al. | |
| 6,576,113 B1 | 6/2003 | Scherer et al. | |
| 6,653,200 B2 | 11/2003 | Olsen | |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,548,201 B2 * | 1/2017 | Zhang | H01L 21/0332 |
| 9,666,451 B2 | 5/2017 | Wallace et al. | |
| 9,679,781 B2 | 6/2017 | Abatchez et al. | |
| 9,721,888 B2 | 8/2017 | Chang et al. | |
| 9,837,314 B2 | 12/2017 | Smith et al. | |
| 10,083,834 B2 | 9/2018 | Thompson et al. | |
| 10,269,647 B2 * | 4/2019 | Zhang | H01L 21/823431 |
| 10,319,604 B2 | 6/2019 | Duan et al. | |
| 10,319,636 B2 | 6/2019 | Basu et al. | |
| 2002/0098642 A1 | 7/2002 | Harris et al. | |
| 2002/0163081 A1 | 11/2002 | Aoyama | |
| 2003/0143862 A1 | 7/2003 | Iyer | |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1 | 8/2006 | Brown et al. | |
| 2006/0286806 A1 | 12/2006 | Ohkuni et al. | |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1 | 7/2008 | Elers | |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2010/0078617 A1 | 4/2010 | Breitwisch et al. | |
| 2010/0096691 A1 | 4/2010 | Shin et al. | |
| 2010/0171220 A1 | 7/2010 | Cheng-Lin | |
| 2010/0173494 A1 | 7/2010 | Kobrin | |
| 2010/0203725 A1 | 8/2010 | Choi et al. | |
| 2010/0301480 A1 | 12/2010 | Choi et al. | |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1 | 10/2013 | Cheong et al. | |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1 | 11/2014 | Zhang et al. | |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 | 10/2015 | Shaviv | |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0141416 A1 | 5/2016 | Mariani et al. | |
| 2016/0163587 A1 | 6/2016 | Backes et al. | |
| 2016/0163640 A1 | 6/2016 | Edelstein et al. | |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0338149 A1 | 11/2017 | Lin | |
| 2018/0096847 A1 | 4/2018 | Thompson et al. | |
| 2018/0130671 A1 | 5/2018 | Duan et al. | |
| 2018/0144980 A1 | 5/2018 | Basu et al. | |
| 2018/0286749 A1 * | 10/2018 | Zhang | H01L 23/5329 |
| 2018/0358260 A1 * | 12/2018 | Roy | H01L 21/7682 |
| 2018/0374750 A1 * | 12/2018 | Zhang | H01J 37/00 |
| 2019/0019676 A1 * | 1/2019 | Zhang | H01L 21/3086 |
| 2019/0067102 A1 * | 2/2019 | Zhang | H01L 21/76897 |
| 2019/0067103 A1 * | 2/2019 | Zhang | H01L 23/5226 |
| 2019/0074219 A1 | 3/2019 | Zhang et al. | |

(56) References Cited

U.S. PATENT DOCUMENTS

2019/0088543 A1* 3/2019 Lin .................. H01L 21/76897
2019/0189510 A1* 6/2019 Lin .................. H01L 21/76883

FOREIGN PATENT DOCUMENTS

| | | | |
|---|---|---|---|
| JP | 2011233922 A | 11/2011 | |
| KR | 100223334 B1 | 10/1999 | |
| KR | 20000026588 A | 5/2000 | |
| KR | 20020020969 A | 3/2002 | |
| WO | 2016/106092 A1 | 6/2016 | |
| WO | 2017136577 A1 | 8/2017 | |

OTHER PUBLICATIONS

PCT International Search Report and Written Opinion in PCT/US2017/053936 dated Jan. 12, 2018, 10 pages.

PCT International Search Report and Written Opinion in PCT/US2017/059737 dated May 18, 2018, 11 pages.

PCT International Search Report and Written Opinion in PCT/US2017/060367 dated Feb. 22, 2018, 9 pages.

PCT International Search Report and Written Opinion in PCT/US2017/060368 dated Jan. 31, 2018, 11 pages.

PCT International Search Report and Written Opinion in PCT/US2018/019146 dated May 23, 2018, 12 pages.

PCT International Search Report and Written Opinion in PCT/US2018/027284 dated Aug. 2, 2018, 10 pages.

PCT International Search Report and Written Opinion in PCT/US2018/036690 dated Sep. 18, 2018, 9 pages.

PCT International Search Report and Written Opinion in PCT/US2018/048503 dated Dec. 14, 2018, 10 pages.

PCT International Search Report and Written Opinion in PCT/US2018/048504 dated Dec. 13, 2018, 10 pages.

PCT International Search Report and Written Opinion in PCT/US2018/048509 dated Dec. 13, 2018, 10 pages.

PCT ISR & Written Opinion for PCT/US2018/026026, dated Jul. 26, 2018, 11 pages.

* cited by examiner

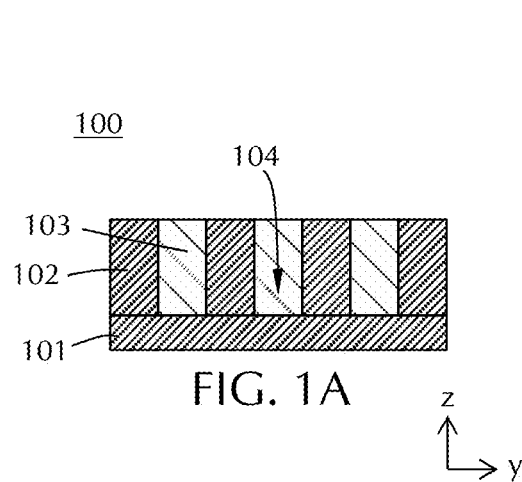
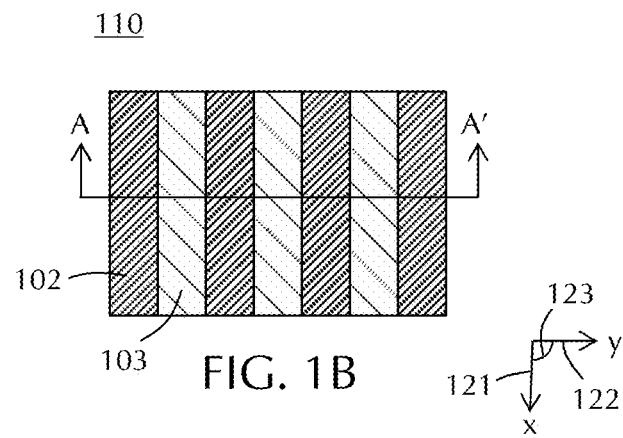
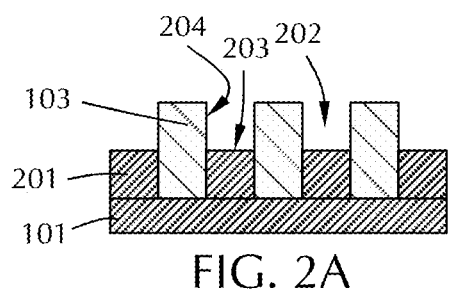
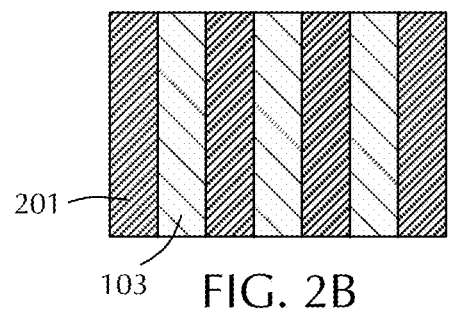
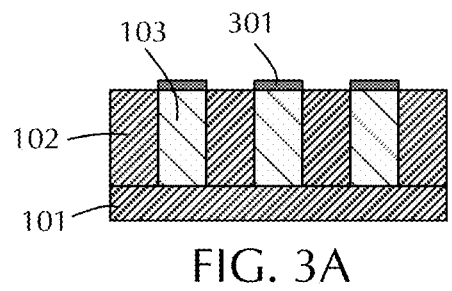
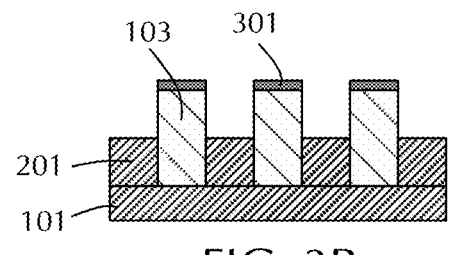
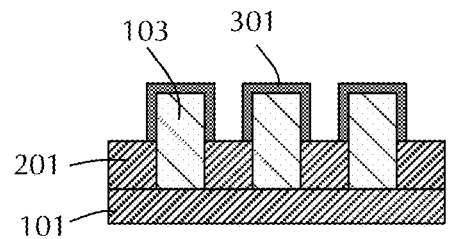

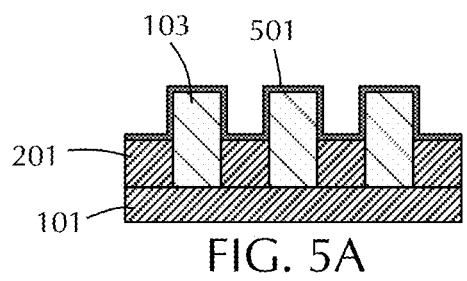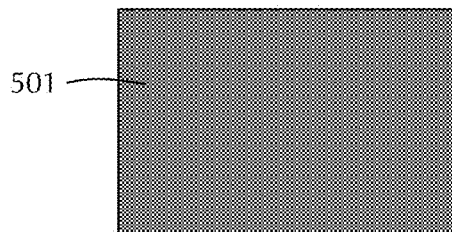
FIG. 5A  FIG. 5B
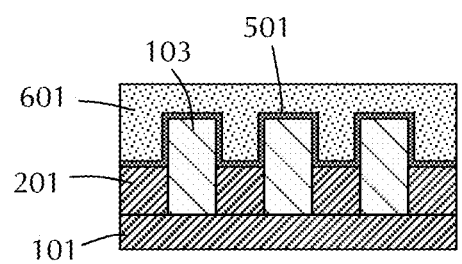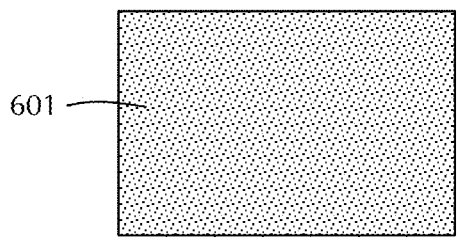
FIG. 6A  FIG. 6B
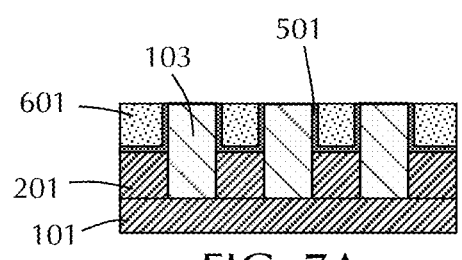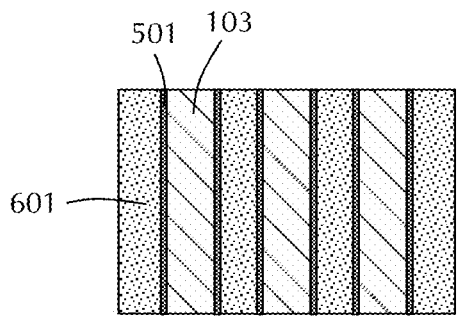
FIG. 7A  FIG. 7B

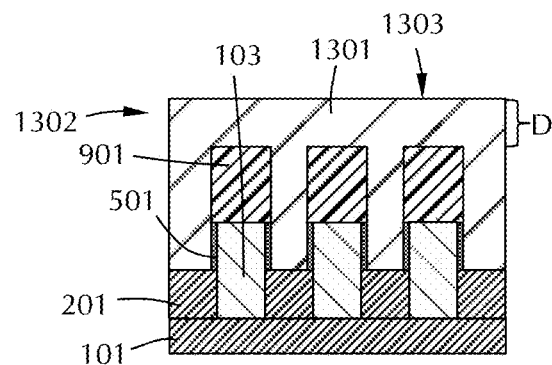 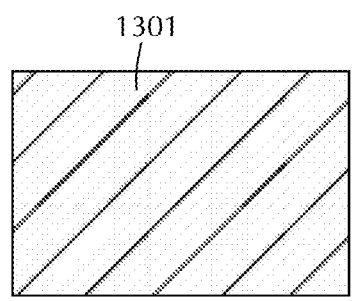
FIG. 14A    FIG. 14B
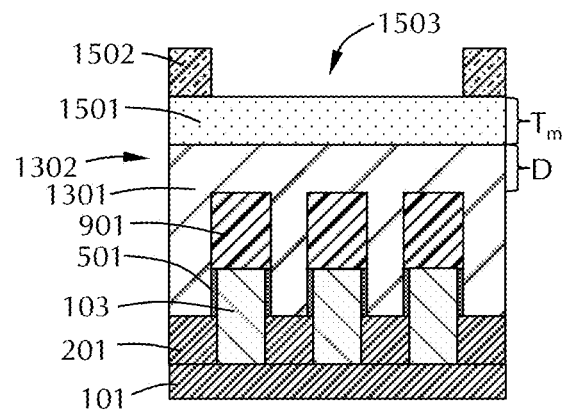 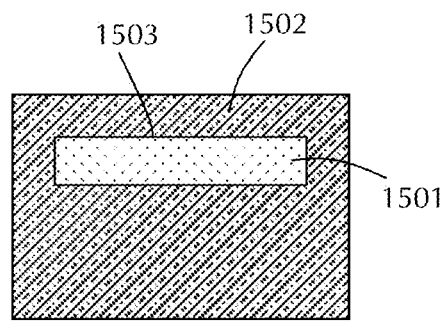
FIG. 15A    FIG. 15B
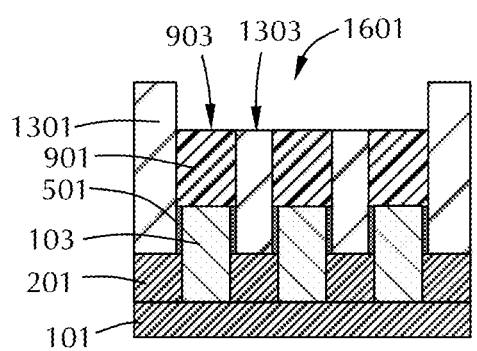 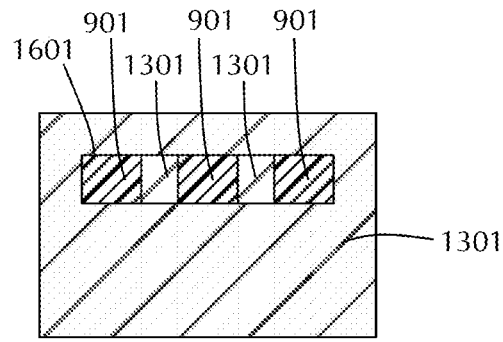
FIG. 16A    FIG. 16B

METHODS OF PRODUCING SELF-ALIGNED VIAS

CROSS-REFERENCE TO RELATED APPLICATIONS

This application claims priority to U.S. Provisional Application No. 62/555,041, filed Sep. 6, 2017, the entire disclosure of which is hereby incorporated by reference herein.

TECHNICAL FIELD

Embodiments of the disclosure generally relate to methods of integrated circuit manufacturing requiring the connecting of multiple layers through vias. More particularly, embodiments of the disclosure are directed to methods of producing vias which are self-aligned such that conductive layers with lines running in opposing directions are connected.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of an interlayer dielectric material are placed between the metallization layers of the IC for insulation.

As the size of the integrated circuit decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide full via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield and increases manufacturing cost.

Therefore, there is an ongoing need in the art for methods of producing self-aligned vias.

SUMMARY

One or more embodiments of the disclosure are directed to methods to provide a self-aligned via. A seed gapfill layer is formed on recessed first insulating layers positioned between first conductive lines. The first conductive lines extend along a first direction. Pillars are formed from the seed gapfill layer. The pillars extend above the first conductive lines. A second insulating layer is deposited in the gaps between the pillars on the first conductive lines. The pillars are removed to form gaps in the second insulating layer. A third insulating layer is deposited in the gaps in the second insulating layer onto the recessed first insulating layers and on the second insulating layer to form an overburden of third insulating layer on the second insulating layer. A portion of the overburden of the third insulating layer and some of the second insulating layer is selectively etched to expose the first conductive lines and form vias and a trench extending in a second direction different from the first direction.

Additional embodiments of the disclosure are directed to methods to provide an electronic device with a self-aligned via. First insulating layers comprising silicon dioxide are recessed to form a substrate with recessed first insulating layers with first conductive lines comprising copper or cobalt. The first conductive lines extend along a first direction. A conformal liner comprising TiN is deposited on the recessed first insulating layers and sidewalls of the first conductive lines. A seed gapfill layer comprising tungsten is formed on the liner of the recessed first insulating layers so that a top of the seed gapfill layer is substantially even with a top of the first conductive lines. The seed gapfill layer is oxidized to form pillars of tungsten oxide on the recessed first insulating layers so that there is a gap between adjacent pillars over the first conductive lines. A second insulating layer is deposited in the gap over the first conductive lines so that a top of the second insulating layer is substantially even with a top of the pillars. The pillars are selectively removed leaving a gap between adjacent second insulating layers. A third insulating layer is deposited in the gaps between adjacent second insulating layers to form an overburden on the top of the second insulating layers. A portion of the third insulating layer is selectively removed to expose the top surface of at least some of the second insulating layers. Some of the second insulating layers are removed to form a via to the first conductive lines and a trench extending in a second direction different than the first direction. A second conductive line is deposited into the via and trench to form second conductive lines extending in a second direction different from the first direction. The second direction crosses the first direction at an angle in the range of about 30° to about 150°.

Further embodiments of the disclosure are directed to systems to manufacture an electronic device. The systems comprise a processing chamber, a plasma source and a processor. The processing chamber comprises a pedestal to hold a substrate comprising a plurality of first conductive lines on a first insulating layer. The first conductive lines extend along a first direction on the first insulating layer. The plasma source is coupled to the processing chamber to generate plasma. The processor is coupled to the plasma source. The processor has one or more configurations to control actions selected from: recessing the first insulating layers, forming a liner on the recessed first insulating layers and first conductive lines, forming a seed gapfill film on the recessed first insulating layers and the first conductive lines, forming pillars from the seed gapfill layer, oxidizing the seed gapfill layer to form pillars on the recessed first insulating layers, depositing a second insulating layer in a gap over the first conductive lines, selectively removing the pillars, depositing a third insulating layer in gaps between adjacent second insulating layers, selectively removing a portion of the third insulating layer, or selectively removing some of the second insulating layers to form a via and trench.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A illustrates a side cross-sectional view of an electronic device structure to provide a fully self-aligned via according to some embodiments;

FIG. 1B is a top view of the electronic device structure depicted in FIG. 1A;

FIG. 2A is a side cross-sectional view of the electronic device structure after the first insulating layers are recessed according to some embodiments;

FIG. 2B is a top view of the electronic device structure of FIG. 2A;

FIG. 3A is a side cross-sectional view of an electronic device structure with a cap on the first conductive lines to allow selective recessing of the first insulating layers according to some embodiments;

FIG. 3B is a side cross-sectional view of the electronic device structure of FIG. 3A after recessing the first insulating layers according to some embodiments;

FIG. 4 is a side cross-sectional view of an electronic device structure with a cap selectively deposited on the first conductive lines after recessing the first insulating layers according to some embodiments;

FIG. 5A is a side cross-sectional view of the electronic device structure after depositing a conformal liner according to some embodiments;

FIG. 5B is a top view of the electronic device structure shown in FIG. 5A;

FIG. 6A is a side cross-sectional view of the electronic device structure after forming a seed gapfill layer with overburden according to some embodiments;

FIG. 6B is a top view of the electronic device structure shown in FIG. 6A;

FIG. 7A is a side cross-sectional view of the electronic device structure after removing the overburden according to some embodiments;

FIG. 7B is a top view of the electronic device structure shown in FIG. 7A;

FIG. 14A is a side cross-sectional view of the electronic device structure after forming an overburden of predetermined depth according to some embodiments;

FIG. 14B is a top view of the electronic device structure shown in FIG. 14A;

FIG. 15A is a side cross-sectional view of the electronic device structure after forming mask layers according to some embodiments;

FIG. 15B is a top view of the electronic device structure shown in FIG. 15A;

FIG. 16A is a side cross-sectional view of the electronic device structure after partially removing the third insulating layer and masks to expose the tops of the second insulating layers according to some embodiments;

FIG. 16B is a top view of the electronic device structure shown in FIG. 16A;

DETAILED DESCRIPTION

Figure 8A:
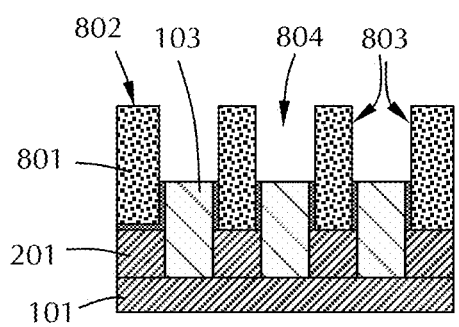
FIG. 8A is a side cross-sectional view of the electronic device structure after forming pillars according to some embodiments.

Methods and apparatuses to provide fully self-aligned vias are described. In some embodiments, a first metallization layer comprising a set of first conductive lines extending along a first direction on a first insulating layer on a substrate is formed. A second insulating layer is formed on the first insulating layer. A second metallization layer comprising a set of second conductive lines above the first metallization layer is formed. The set of second conductive lines extend along a second direction. A via is formed between the first metallization layer and the second metallization layer. The via is self-aligned along the second direction to one of the first conductive lines. The via is self-aligned along the first direction to one of the second conductive lines, as described in further detail below. In some embodiments, the first and second directions cross each other at an angle. In some embodiments, the first direction and second direction are substantially orthogonal to each other.

In some embodiments, a fully self-aligned via is fabricated using a selective pillar growth technique. In some embodiments, the first insulating layers on a substrate are recessed. The first insulating layers and the conductive lines extend along a first direction on the substrate. Pillars are formed on the recessed first insulating layers. A second insulating layer is deposited between the pillars. The pillars are selectively etched relative to the second insulating layer to form an opening down to one of the first insulating layers and a third insulating layer is deposited in the openings. At least some of the second insulating layer is removed to form vias to the conductive lines.

In some embodiments, a fully self-aligned via is the via that is self-aligned along at least two directions to the conductive lines in a lower and an upper metallization layers. In some embodiments, the fully self-aligned via is defined by a hard mask in one direction and the underlying insulating layer in another direction, as described in further detail below.

One or more embodiments provide fully self-aligned vias that advantageously eliminate the via misalignment issues and avoid shorting to the wrong metal line. The fully self-aligned vias provide lower via resistance and capacitance benefits over the conventional vias. Embodiments of the self-aligned vias provide full alignment between the vias and the conductive lines of the metallization layers that is substantially error free that advantageously increases the device yield and reduces the device cost.

In the following description, numerous details, such as materials, chemistries, dimensions of the elements, etc., are set forth in order to provide a thorough understanding of one or more of the embodiments of the present disclosure. One of ordinary skill in the art will understand that the one or more embodiments of the disclosure may be practiced without these details. In other instances, semiconductor fabrication processes, techniques, materials, equipment, etc., have not been described in details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "some embodiments", "another embodiment", or "an embodiment" means that a particular feature, structure, or characteristic described in connection with the embodiment is included in at least some embodiments of the present disclosure. Thus, the appearance of phrases like "in some embodiments" or "in an embodiment" in various places throughout the specification are not necessarily all referring to the same embodiment of the disclosure. Furthermore, the particular features, structures, or characteristics may be combined in any suitable manner in one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods and apparatus to provide fully self-aligned vias. The various aspects of the disclosure are described with respect to a detailed process illustrated in the Figures. Those skilled in the art will understand that the scope of the disclosure is not limited to the particular details described in the Figures and that some portions of the process can be altered or omitted.

A process for forming self-aligned vias is described with reference to FIGS. 1A through 19B. In each of FIGS. 1A through 19B (excluding FIGS. 3A, 3B and 4), the Figure denoted 'A' (e.g., FIG. 1A) shows a cross-sectional view and the Figure denoted 'B' (e.g., FIG. 1B) shows a top view of a semiconductor device. The side view of the A Figures is taken along a plane illustrated in the respective B Figures. For example, FIG. 1B illustrates a top view of a device structure and FIG. 1A shows a cross-sectional view of the device structure illustrated in FIG. 1B.

FIG. 1A illustrates a cross-sectional view 100 of an electronic device structure to provide a fully self-aligned via or air gap according to some embodiments. FIG. 1B is a top view 110 of the electronic device structure depicted in FIG. 1A. The cross-sectional view 100 is along an axis A-A', as depicted in FIG. 1B. A lower metallization layer (Mx) comprises a set of conductive lines 103 and insulating layers 102 that extend along an X axis (direction) 121 on a substrate 101. As shown in FIG. 1B, X direction 121 crosses a Y axis (direction) 122 at an angle 123. In one or more embodiments, angle 123 is about 90 degrees. In some embodiments, angle 123 is an angle that is other than a 90 degree angle. The insulating layers 102 form trenches 104 which are the gaps between adjacent insulating layers 102. The conductive lines 103 are shown in trenches 104.

In some embodiments, the substrate 101 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 101 includes one or more metallization interconnect layers for integrated circuits. In some embodiments, the substrate 101 includes interconnects, for example, vias, configured to connect the metallization layers. In some embodiments, the substrate 101 includes electronic devices, e.g., transistors, memories, capacitors, resistors, optoelectronic devices, switches, and any other active and passive electronic devices that are separated by an electrically insulating layer. For example, an interlayer dielectric, a trench insulation layer or any other insulating layer known to one of ordinary skill in the art of the electronic device manufacturing. In some embodiments, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In some embodiments, electrically insulating layer 102 is an oxide layer, e.g., silicon dioxide, or any other electrically insulating layer determined by an electronic device design. In some embodiments, insulating layer 102 comprises an interlayer dielectric (ILD). In some embodiments, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride or any combination thereof. In the illustrated embodiment, the insulating layers 102 are shown as being the same material as the substrate 101.

In some embodiments, insulating layer 102 includes a dielectric material having k value less than 5. In some embodiments, insulating layer 102 includes a dielectric material having k-value less than 2. In some embodiments, insulating layer 102 includes a nitride, oxide, a polymer, phosphosilicate glass, Fluorosilicate (SiOF) glass, organosilicate glass (SiOCH), other electrically insulating layer determined by an electronic device design, or any combination thereof. In some embodiments, insulating layer 102 may include polyimide, epoxy, photodefinable materials, such as benzocyclobutene (BCB), and WPR-series materials, or spin-on-glass.

In some embodiments, insulating layer 102 is a low-k interlayer dielectric to isolate one metal line from other metal lines on substrate 101. In some embodiments, the thickness of the layer 102 is in an approximate range from about 10 nanometers (nm) to about 2 microns (μm).

In some embodiments, insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALO"), spin-on, or other insulating deposition techniques known to one of ordinary skill in the art of microelectronic device manufacturing.

In some embodiments, the lower metallization layer Mx comprising metal lines 103 is a part of a back end metallization of the electronic device. In some embodiments, the insulating layer 102 is patterned and etched using a hard mask to form trenches 104 using one or more patterning and etching techniques known to one of ordinary skill in the art of microelectronic device manufacturing. In some embodiments, the size of trenches 104 in the insulating layer 102 is determined by the size of conductive lines formed later on in a process.

In some embodiments, forming the conductive lines 103 involves filling the trenches 104 with a layer of conductive material. In some embodiments, a base layer (not shown) is first deposited on the internal sidewalls and bottom of the trenches 104, and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 102. Additionally, the conductive barrier layer can be used to provide adhesion for the seed layer (e.g., copper).

In some embodiments, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any thin film deposition technique known to one of ordinary skill in the art of semiconductor manufacturing, e.g., sputtering, blanket deposition, and the like. In some embodiments, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer e.g., copper, is deposited onto the seed layer of base layer of copper, by an electroplating process. In some embodiments, the conductive layer is deposited into the trenches 104 using a damascene process known to one of ordinary skill in the art of microelectronic device manufacturing. In some embodiments, the conductive layer is deposited onto the seed layer in the trenches 104 using a selective deposition technique, such as but not limited to electroplating, electroless, a CVD, PVD, MBE, MOCVD, ALO, spin-on, or other deposition techniques known to one of ordinary skill in the art of microelectronic device manufacturing.

In some embodiments, the choice of a material for conductive layer for the conductive lines 103 determined the choice of a material for the seed layer. For example, if the material for the conductive lines 103 includes copper, the material for the seed layer also includes copper. In some embodiments, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hi), tantalum (Ta), tungsten (W), Vanadium (V), Molybdenum (Mo), palladium (Pd), gold (Au), silver (Au), platinum PI, indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 103 of the metallization layer Mx are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In some embodiments, portions of the conductive layer and the base layer are removed to even out top portions of the conductive lines 103 with top portions of the insulating layer 102 using a chemical-mechanical polishing ("CMP") technique known to one of ordinary skill in the art of microelectronic device manufacturing.

In one non-limiting example, the thickness of the conductive lines 103 is in an approximate range from about 15 nm to about 1000 nm. In one non-limiting example, the thickness of the conductive lines 103 is from about 20 nm to about 200 nm. In one non-limiting example, the width of the conductive lines 103 is in an approximate range from about 5 nm to about 500 nm. In one non-limiting example, the spacing (pitch) between the conductive lines 103 is from about 2 nm lo about 500 nm. In more specific non-limiting example, the spacing (pitch) between the conductive lines 103 is from about 5 nm to about 50 nm.

In some embodiments, the lower metallization layer Mx is configured to connect to other metallization layers (not shown). In some embodiments, the metallization layer Mx is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

FIG. 2A and FIG. 2B show the electronic device structure after the insulating layers 102 are recessed according to some embodiments. The insulating layers 102 are recessed to a predetermined depth to form recessed insulating layers 201. As shown in FIGS. 2A and 2B, trenches 202 are formed in the insulating layer 201. Each trench 202 has sidewalls 204 that are portions of conductive lines 103 and a bottom that is a top surface 203 of the recessed insulating layer 201.

In some embodiments, the depth of the trenches 202 is from about 10 nm to about 500 nm. In some embodiments, the depth of the trenches 202 is from about 10% to about 100% of the thicknesses of the conductive lines. In some embodiments, the insulating layers 102 are recessed using one or more of wet etching, dry etching, or a combination of techniques known to one of ordinary skill in the art of electronic device manufacturing.

FIGS. 3A and 3B illustrate a process for recessing the insulating layers 102 in accordance with one or more embodiment. A liner or cap 301 is selectively grown on the conductive lines 103. The cap 301 of some embodiments acts as an adhesion layer for a material that will be grown into pillars or for gapfill. The cap 301 of some embodiments protects the conductive lines 103 during the process of forming the self-aligned pillars. The cap 301 of some embodiments acts as an electromagnetic migration barrier layer for metal (e.g., copper) lines. The cap 301 of some embodiments serves as an etch stop layer for dual damascene via etch processes. In some embodiments, the cap 301 is conductive and can remain on the conductive lines 103 after recessing the insulating layers 102.

The cap 301 can be any suitable material depending on the conductive lines 103 and the process being used to recess the insulating layers 102. In some embodiments, the cap 301 is cobalt and the conductive lines 103 are copper metal lines.

In FIG. 3A, the cap 301 is formed on a top of the conductive lines 103 selectively relative to the insulating layers 102. Selective deposition or formation of the cap 301 can be done by any suitable technique known to the skilled artisan. After formation of the cap 103, as shown in FIG. 3B, the insulating layers 102 can be recessed to form recessed insulating layers 201 without etching or removing the conductive lines 103. FIG. 4 shows an embodiment in which a cap 301 is formed on the conductive lines 103 after forming the recessed insulating layers 201. The cap 301 can remain on the conductive lines 103 or be removed.

FIGS. 5A and 5B show the electronic device structure after a liner 501 is deposited on the recessed insulating layers 201 and conductive lines 103 according to some embodiments. Liner 501 is deposited on the bottom and sidewalls of the trenches 202, as shown in FIG. 5A.

In some embodiments, liner 501 is deposited to protect the conductive lines 201 from changing the properties later on in a process (e.g., during tungsten deposition, or other processes). In some embodiments (not shown), the liner 501 is not deposited. In some embodiments, liner 501 is a conductive liner. In another embodiment, liner 501 is a non-conductive liner. In some embodiments, when liner 501 is a non-conductive liner, the liner 501 is removed later on in a process, as described in further detail below. In some embodiments, liner 501 includes titanium nitride (TiN), titanium (Ti), tantalum (Ta), tantalum nitride (TaN), or any combination thereof. In another embodiment, liner 501 is an oxide, e.g., aluminum oxide (AlO), titanium oxide ($TiO_2$). In yet another embodiment, liner 501 is a nitride, e.g., silicon nitride (SiN) or aluminum nitride (AlN). In an embodiment, the liner 501 is deposited to the thickness from about 0.5 nm to about 10 nm.

In some embodiments, the liner 501 is deposited using an atomic layer deposition (ALD) technique. In some embodiments, the liner 501 is deposited using one of deposition techniques, such as but not limited to a CVD, PVD, MBE, MOCVD, spin-on, or other liner deposition techniques known to one of ordinary skill in the art of microelectronic device manufacturing.

In some embodiments, the liner 501 is selectively deposited on the top surface of the conductive lines 103 without being deposited on the sidewalls 204 of the trench 202, as shown in FIG. 3A. In some embodiments, the liner 501 is deposited conformally on both the recessed insulating layer 201 and the conductive lines 103 then removed from the recessed insulating layer 201. The liner 501 may be removed from the recessed insulating layer 201 by any suitable process.

FIGS. 6A and 6B illustrate the electronic device structure after a seed gapfill layer 601 is deposited on the liner 501 according to some embodiments. In some embodiments, seed gapfill layer 601 is a self-aligned selective growth seed film. As shown in FIG. 6A and FIG. 6B, seed gapfill layer 601 is deposited on liner 501 on the top surface 203 of the recessed insulating layers 201, the sidewalls 204 of the trenches 202 and top portions of the conductive lines 103. In some embodiments, seed gapfill layer 601 is a tungsten (W) layer, or other seed gapfill layer to provide selective growth pillars. In some embodiments, seed gapfill layer 601 is a metal film or a metal containing film. Suitable metal films include, but are not limited to, films including one or more of Co, Mo, W, Ta, Ti, Ru, rhodium (Rh), Cu, Fe, Mn, V, Niobium (Nb), hafnium (Hf), Zirconium (Zr), Yttrium (Y), Al, Sn, Cr, Lanthanum (La), or any combination thereof. In some embodiments, seed gapfill layer 601 comprises is a tungsten (W) seed gapfill layer. Without limiting the composition of the seed gapfill layer, the seed gapfill layer may be referred to in this description and the appended claims as a metal layer.

In some embodiments, the seed gapfill layer 601 is deposited using one of deposition techniques, such as but not limited to an ALD, a CVD, PVD, MBE, MOCVD, spin-on, or other liner deposition techniques known to one of ordinary skill in the art of microelectronic device manufacturing.

FIG. 7A and FIG. 7B illustrate the electronic device structure after portions of the seed gapfill layer 601 and liner 501 on the top of the conductive lines 103 are removed according to some embodiments. In some embodiments, portions the seed gapfill layer 601 are removed such that a predetermined thickness of seed gapfill layer 601 remains. In some embodiments, the portions of the seed gapfill layer 601 are removed using one of the chemical-mechanical polishing (CMP) techniques known to one of ordinary skill in the art of microelectronic device manufacturing.

Figure 8B:
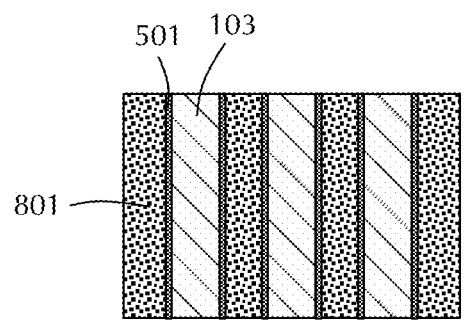
FIG. 8B is a top view of the electronic device structure shown in FIG. 8A.

FIGS. 8A and 8B illustrate the electronic device structure after self-aligned selective growth pillars 801 are formed using the seed gap fill layer 601 on the liner 501 on the recessed insulating layers 201 according to one or more embodiment. The pillars 801 have a top surface 802 and sidewalls 803. After formation of the pillars 801, a gap 804 is formed between the sidewalls 803 of adjacent pillars 801. As shown in FIGS. 8A and 8B, an array of the self-aligned selective growth pillars 801 has the same pattern as the set of the recessed insulating layers 201. As shown in FIGS. 8A and 8B, the pillars 801 extend substantially orthogonally from the top surfaces of the recessed insulating layers 201. The pillars 801 extend along the same direction as the recessed insulating layers 201 and the conductive lines 103.

In some embodiments, the pillars 801 are selectively grown from the seed gapfill layer 601 on portions of the liner 501 on the recessed insulating layers 201. In some embodiments, portions of the seed gapfill layer 601 above the recessed insulating layers 201 are expanded for example, by oxidation, nitridation, or other process to grow pillars 801. In some embodiments, the seed gapfill layer 601 is oxidized by exposure to an oxidizing agent or oxidizing conditions to transform the metal or metal containing seed gapfill layer 601 to metal oxide pillars 801. Those skilled in the art will understand that forming the pillar is done by an electrochemical oxidation and does not necessarily contain oxygen. In some embodiments, pillars 801 include an oxide of one or more metals listed above. In some embodiments, pillars 801 include tungsten oxide (e.g., WO, $WO_3$ and other ratios of tungsten and oxygen). In some embodiments, the pillars 801 comprise a nitride (e.g., WN or other ratio of tungsten and nitrogen).

The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In some embodiments, the pillars 801 are formed by oxidation of the seed gapfill layer 601 at any suitable temperature depending on, for example, the composition of the seed gapfill layer and the oxidizing agent. In some embodiments, the oxidation occurs at a temperature in an approximate range of about 25° C. to about 800° C. In some embodiments, the oxidation occurs at a temperature greater than or equal to about 150° C. In some embodiments, the height of the pillars 801 is in an approximate range from about 5 angstroms (Å) to about 10 microns (μm).

Figure 9A:
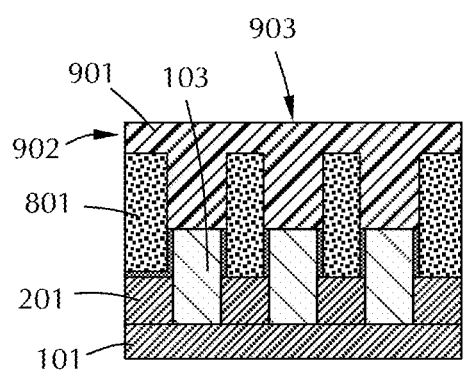
FIG. 9A is a side cross-sectional view of the electronic device structure after depositing the second insulating layer with overburden according to some embodiments.
Figure 9B:
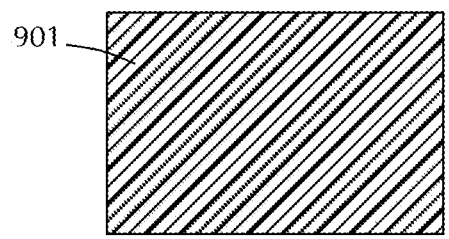
FIG. 9B is a top view of the electronic device structure shown in FIG. 9A.

FIGS. 9A and 9B illustrate the electronic device structure after a second insulating layer 901 is deposited to fill the gap 804 between the pillars 801. The second insulating layer 901 can be any suitable dielectric material as described herein with regard to insulating layer 102. The second insulating layer 901 can be the same material as insulating layer 102 or a different material than insulating layer 102.

In some embodiments, insulating layer 901 is a low-k gapfill layer. In some embodiments, insulating layer 901 is flowable. In some embodiments, insulating layer 901 is a flowable silicon oxide (FSiOx) layer. In some embodiments, insulating layer 901 is an oxide layer, e.g., silicon dioxide, or any other electrically insulating layer determined by an electronic device design. In some embodiments, insulating layer 901 is an interlayer dielectric (ILD). In some embodiments, insulating layer 901 is a low-k dielectric that includes, but is not limited to, materials such as, e.g., silicon dioxide, silicon oxide, a carbon based material, e.g., a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, insulating layer 901 is a dielectric material having k-value less than 3. In some embodiments, insulating layer 901 is a dielectric material having k-value in an approximate range from about 2.2 to about 2.7. In some embodiments, insulating layer 901 includes a dielectric material having k-value less than 2.

In some embodiments, insulating layer 901 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

In the embodiment illustrated in FIGS. 9A and 9B, the second insulating layer 901 is deposited with a sufficient thickness to form an overburden 902. As used in this manner, the overburden 902 refers to the portion of the second insulating layer 901 that covers the top 802 of the pillars 801. In some embodiments, the second insulating layer 901 is deposited within the gap 804 to a thickness less than the height of the pillars 801 so that no overburden 902 is formed. In some embodiments, the thickness of the second insulating layer 901 is formed in the gap 804 so that the top 903 of the second insulating layer 901 is substantially equal to a top of the pillars 801. As used in this manner, the term "substantially equal to" or "substantially coplanar with" or "substantially even with" means that the top 903 of the second insulating layer 901 is within ±5 Å, ±4 Å, ±3 Å, ±2 Å or ±1 Å of the top of the pillars 801.

Figure 10A:
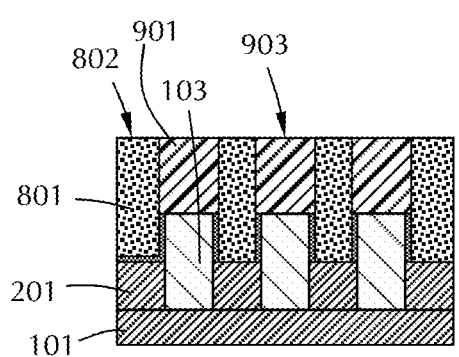
FIG. 10A is a side cross-sectional view of the electronic device structure after removing the overburden according to some embodiments.
Figure 10B:
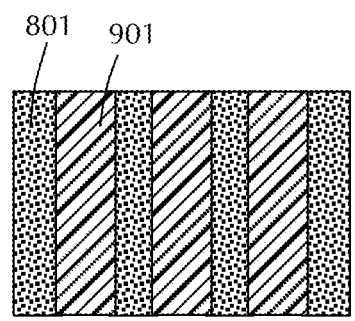
FIG. 10B is a top view of the electronic device structure shown in FIG. 10A.

FIGS. 10A and 10B illustrate the electronic device structure of FIGS. 9A and 9B, respectively, after chemical-mechanical planarization (CMP) of the overburden 902 from the second insulating layer 901 to expose the top 802 of the pillars 801 according to some embodiments. As shown, the second insulating layer 901 is removed such that the tops 802 of the pillars 801 are exposed while the top 903 of the second insulating layer 901 remains substantially coplanar with the top 802 of the pillars 801. The CMP process can be any suitable planarization process known to those skilled in the art. In some embodiments, the second insulating layer 901 is deposited so that the top 903 of the second insulating layer 901 is substantially even with or slightly below the top 802 of the pillars 801 and the CMP process is not performed.

Figure 11A:
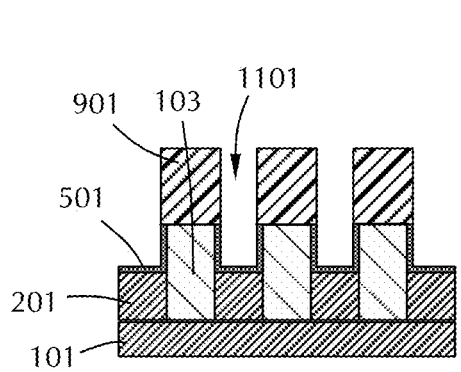
FIG. 11A is a side cross-sectional view of the electronic device structure after the pillars have been removed according to some embodiments.
Figure 11B:
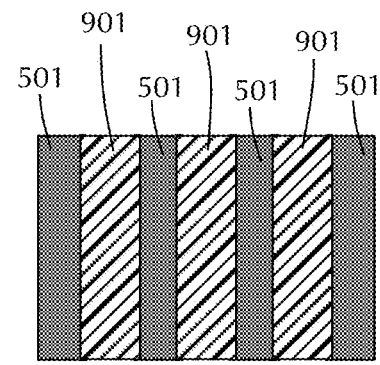
FIG. 11B is a top view of the electronic device structure shown in FIG. 11A.

FIGS. 11A and 11B illustrate the electronic device structures of FIGS. 10A and 10B, respectively, after the pillars 801 are removed via etch according to some embodiments. Removal of etching of the pillars 801 leaves a gap 1101 between adjacent second insulating layers 901. The pillars 801 are selectively removed relative to the second insulating layer 901 and the liner 501 or insulating layer 201 (if no liner 501 is present). Etching or removal of the pillars 801 can be done by any suitable technique. In some embodiments, etching the pillars 801 comprises exposing the pillars 801 and the sheet 602 to a metal halide compound. In some embodiments, the metal halide compound has the same metal as the pillars 801. In some embodiments, the metal halide compound has a different metal than the pillars 801.

In some embodiments, etching the pillars 801 comprises exposure to a metal-and-halogen-containing precursor (e.g. $WCl_6$), also referred to as a metal halide precursor. The metal halide precursor can react with the pillars 801. In some embodiments, exposure to the metal halide precursor causes an exothermic reaction with the pillar material and no plasma is present in the substrate processing region. In some embodiments, there is no plasma used to excite the metal-halide precursor prior to entering the substrate processing region.

In an exemplary non-limiting process, the pillars 801 comprise tungsten and are grown by reaction with oxygen to form the tungsten oxide pillars, which may take the form of $WO_3$. Exposure of $WO_3$ to $WCl_6$ (or possibly $WCl_6$) forms volatile $WOCl_4$ and/or $WO_2Cl_2$ which leaves the surface until all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_6$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

Etching can be performed in this part of the process, or any other part of the process incorporating an etch, by any suitable etch technique known to those skilled in the art. In some embodiments, the etch process is one or more of a dry etch or wet etch. In some embodiments, the etch solution comprises 5 wt % ammonium hydroxide aqueous solution at a temperature of about 80° C. In some embodiments, hydrogen peroxide is added to the ammonium hydroxide solution to increase the etch rate. In some embodiments, a hydrofluoric acid and nitric acid in a ratio of about 1:1 is used to etch. In some embodiments, the HF and $HNO_3$ in a ratio of about 3:7, respectively, is used to etch. In some embodiments, the HF:$HNO_3$ ratio is about 4:1. In some embodiments, the pillars 801 include tungsten and/or titanium and are etched using ammonium hydroxide:hydrogen peroxide in a ratio of 1:2. In some embodiments, the pillars 801 and sheet 602 are selectively wet etched using 305 grams of potassium ferricyanide ($K_3Fe(CN)_6$), 44.5 grams of sodium hydroxide (NaOH) and 1000 ml of water ($H_2O$). In some embodiments, the pillars 801 are selectively wet etched using diluted or concentrated one or more of the chemistries including hydrochloric acid (HCl), $HNO_3$, sulfuric acid ($H_2SO_4$), HF, and $H_2O_2$. In some embodiments, the pillars 801 are selectively wet etched using HF, $HNO_3$ and acetic acid (HAc or HOAc) in a ratio of 4:4:3, respectively. In some embodiments, the pillars 801 are selectively dry etched using a bromotrifluoromethane ($CBrF_3$) reactive ion etching (RIE) technique. In some embodiments the pillars 801 are selectively dry etched using chlorine, fluorine, bromine or any combination thereof based chemistries. In some embodiments, the pillars 801 are selectively wet etched using hot or warm Aqua Regia mixture including HCl and $HNO_3$ in a ratio of 3:1, respectively. In some embodiments, the pillars 801 are selectively etched using alkali with oxidizers (potassium nitrate ($KNO_3$) and lead dioxide ($PbO_2$)).

Figure 12A:
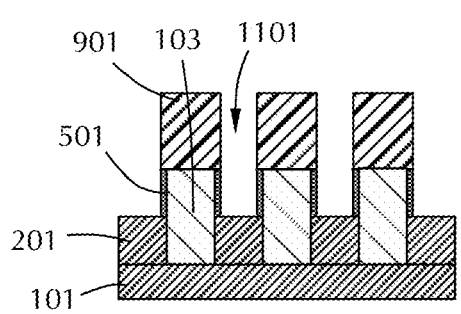
FIG. 12A is a side cross-sectional view of the electronic device structure after removing the liner from the top of the recessed first insulating layers according to some embodiments.
Figure 12B:
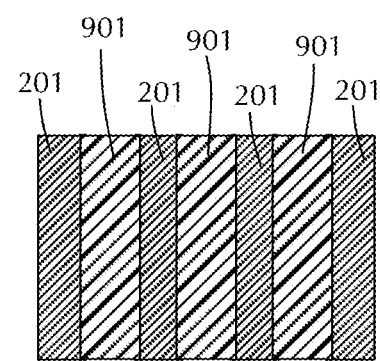
FIG. 12B is a top view of the electronic device structure shown in FIG. 12A.

In the embodiment illustrated in FIGS. 11A and 11B, the liner 501 remains at the bottom of the gap 1101. In some embodiments, as illustrated in FIGS. 12A and 12B, the liner 501 is selectively removed from the bottom of the gap 1101 to expose the recessed insulating layer 201. The liner 501 can be selectively removed using one or more of the dry and wet etching techniques known to one of ordinary skill in the art of electronic device manufacturing. Those skilled in the art will understand that, depending on the liner 501 material, the liner 501 may or may not be removed from the bottom of the gap 1101. In the embodiment illustrated in FIGS. 12A and 12B, the liner is removed only from the bottom of the gap 1101 and a portion of liner 501 remains on the sides of the conductive lines 103.

Figure 13A:
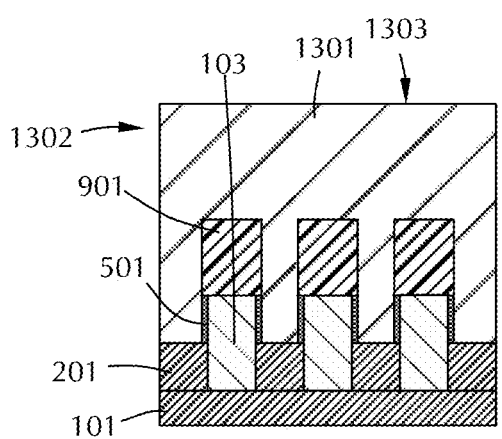
FIG. 13A is a side cross-sectional view of the electronic device structure after forming a third insulating layer with overburden according to some embodiments.
Figure 13B:
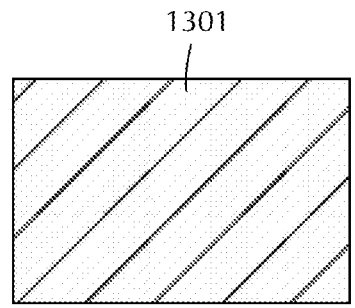
FIG. 13B is a top view of the electronic device structure shown in FIG. 13A.

FIGS. 13A and 13B illustrate the electronic device structure of FIGS. 12A and 12B, respectively, after a third insulating layer 1301 has been deposited. In some embodiments, the third insulating layer 1301 fills the gaps 1101 between the second insulating layers 901 and contacts the recessed insulating layer 201. In the illustrated embodiment, the third insulating layer 1301 contacts liner 501 on the sides of the conductive lines 103. In an embodiment where the liner 501 has been completely removed or is not present, the third insulating layer 1301 contacts the conductive lines 103.

In the embodiment illustrated in FIGS. 13A and 13B, the third insulating layer 1301 is deposited with a sufficient thickness to form an overburden 1302. As used in this manner, the overburden 1302 refers to the portion of the third insulating layer 1301 that covers the top of the pillars second insulating layer 901. In some embodiments, the third insulating layer 1301 is deposited within the gap 1101 to a thickness less than the height of the second insulating layer 901 so that no overburden 1302 is formed. In some embodiments, the thickness of the third insulating layer 1301 is formed in the gap 1101 so that the top of the second insulating layer 901 is substantially equal to a top 1303 of the third insulating layer 1301. As used in this manner, the term "substantially equal to" or "substantially coplanar with" or "substantially even with" means that the top 903 of the second insulating layer 901 is within ±5 Å, ±4 Å, ±3 Å, ±2 Å or ±1 Å of the top 1303 of the third insulating layer 1301.

The third insulating layer 1301 comprises a third insulating material. The third insulating layer 1301 can be any suitable dielectric material as described herein with regard to insulating layer 102, recessed insulating layer 201 or second insulating layer 901. In some embodiments, the third insulating layer 1301 is the same as one or more of the recessed insulating layer 201 or the second insulating layer 901. In some embodiments, the third insulating layer 1301 is different than the recessed insulating layer 201 and the second insulating layer 901.

FIGS. 14A and 14B illustrate the electronic device structure of FIGS. 12A and 12B, respectively, after the third insulating layer 1301 has been deposited and/or etched such that the overburden 1302 has a predetermined depth D according to some embodiments. In the embodiment shown, an overburden 1302 of the third insulating layer 1301 is deposited as shown in FIGS. 13A and 13B and then removed or etched to leave a predetermined depth D as shown in FIGS. 14A and 14B. In some embodiments, the overburden 1302 can be removed by a chemical-mechanical planarization (CMP) process known to those skilled in the art.

In some embodiments, the third insulating layer 1301 is deposited such that the top 1303 of the third insulating layer 1301 it is substantially coplanar with the top 903 of the second insulating layer 901. A predetermined thickness (or depth) of third insulating layer 1301 can then be deposited to establish a predetermined depth D of overburden 1302 of third insulating layer 1301.

FIGS. 15A and 15B illustrate the electronic device structure of FIGS. 13A and 13B, respectively, after a first mask 1501 and a second mask 1502 have been deposited on the third insulating layer 1301 according to some embodiments. Those skilled in the art will recognize that the masking and insulator layers can be single or multiple layers. The first mask 1501 can be deposited over most or all of the third insulating layer 1301 and the second mask 1502 is deposited or formed with an opening 1503, exposing the first mask 1501 through the opening 1503. The first mask 1501 and/or second mask 1502 can be any suitable material. In some embodiments, one or more of first mask 1501 or second mask 1502 comprise one or more of silicon nitride, silicon oxide, silicon oxynitride, silicon carbide, silicon oxycarbide, silicon carbonitride or silicon oxycarbonitride. In some embodiments, one or more of the first mask 1501 or second mask 1502 comprises a photoresist. In some embodiments, the depth D of the third insulating layer 1301 overburden 1302 and the thickness $T_m$ of the first mask 1501 is substantially the same. As used in this manner, the term "substantially the same" means that the thickness Tm of the first mask 1501 and the depth D of the overburden 1302 of the third insulating layer 1301 are within 10% or 5% relative to the average.

FIGS. 16A and 16B illustrate the electronic device structure of FIGS. 15A and 15B, respectively, after an etch process isotropically removes a portion of the third insulating layer 1301 that is not directly below second mask 1502 according to some embodiments. The illustrated embodiment has the first mask 1501 and second mask 1502 removed. After the isotropic removal, a portion of the third insulating layer 1301 and portion of the second insulating layer 901 are exposed. The removal forms a trench 1601 in which a tops 903 of second insulating layers 901 and tops 1303 of third insulating layers 1301 are exposed.

The third insulating layer 1301, first mask 1501 and second mask 1502 can be removed by any suitable technique or combination of techniques. For example an etch process could selectively remove the third insulating layer 1301, first mask 1501 and second mask 1502 without affecting second insulating layer 901. In some embodiments, more than one etch process is used to remove the third insulating layer 1301, first mask 1501 and second mask 1502. For example, a first etch process can be used to remove first mask 1501 and third insulating layer 1301 and a second etch process can be used to remove second mask 1502 and any remaining first mask 1501. In some embodiments, there are three etch processes used to remove the three layers with each etch process selective for one of the layers.

Figure 17A:
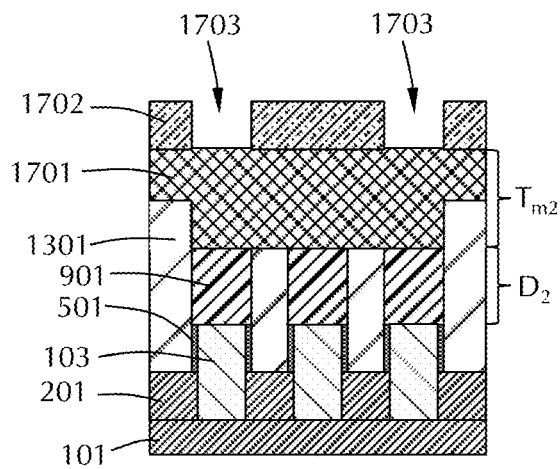
FIG. 17A is a side cross-sectional view of the electronic device structure after forming mask layers on the exposed second insulating layers according to some embodiments.
Figure 17B:
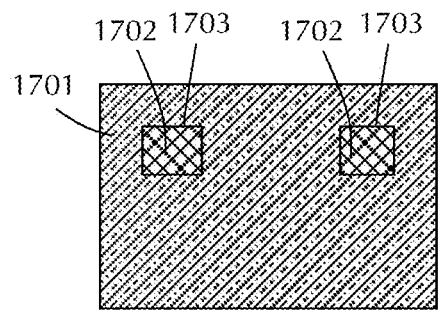
FIG. 17B is a top view of the electronic device structure shown in FIG. 17A.

FIGS. 17A and 17B illustrate the electronic device structure of FIGS. 15A and 15B, respectively, after forming first mask 1701 and second mask 1702. The first mask 1701 is formed on the top 903 of the second insulating layer 901 and the top 1303 of the third insulating layer 1301 exposed in opening 1601 according to some embodiments. The second mask 1702 has openings 1703 through which the first mask 1701 is exposed. The openings 1703 are aligned over second insulating layers 901. The size of the openings 1703 (along the x-axis) can be smaller than, equal to or larger than the thickness of the related second insulating layers 901. The first mask 1701 and the second mask 1702 may be the same or different than the first mask 1501 and the second mask 1502, respectively.

A first mask 1701 and a second mask 1702 are illustrated on the third insulating layer 1301 and the second insulating layer 901. The first mask 1701 is shown covering all of the third insulating layer 1301 and the second insulating layer 901. The second mask 1702 is shown covering a smaller area. Those skilled in the art will recognize that the first mask and/or second mask can be a single layer or made up of multiple masking and insulator layers. In some embodiments, the thickness $T_{m2}$ of the first mask 1701, measured from the top of the second insulating layer 901, and the thickness $D_2$ of the second insulating layer 901 are substantially the same.

Figure 18A:
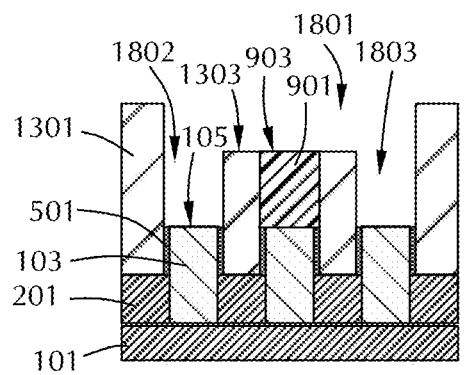
FIG. 18A is a side cross-sectional view of the electronic device structure after removing the mask layers and some of the exposed second insulating layers to form vias and a trench according to some embodiments.
Figure 18B:
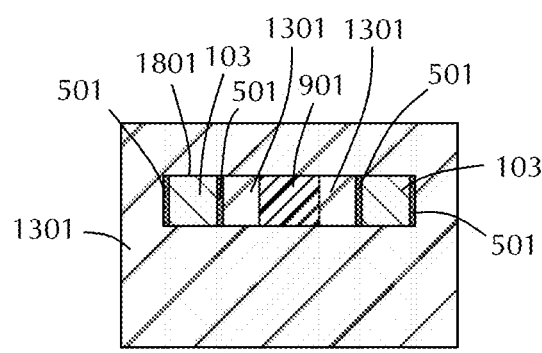
FIG. 18B is a top view of the electronic device structure shown in FIG. 18A.

FIGS. 18A and 18B illustrate the electronic device structure of FIGS. 17A and 17B, respectively, after an etch process isotropically removes the third insulating layer 1301 and second insulating layer 901 that is not directly below the second mask 1702 according to some embodiments. Stated differently, portions of the second insulating layer 901, third insulating layer 1301 and first mask 1701 exposed through opening 1703 in the second mask 1702 are removed. After the isotropic removal, the top 105 of conductive lines 103, the top 903 of second insulating layer 901, the top 1303 of third insulating layer 1301 are exposed in trench 1801.

The second insulating layer 901, third insulating layer 1301, first mask 1701 and second mask 1702 can be removed by any suitable technique or combination of techniques. For example an etch process could selectively remove the third insulating layer 1301, first mask 1701 and second mask 1702 without affecting second insulating layer 901. In some embodiments, more than one etch process is used to remove the second insulating layer 901, third insulating layer 1301, first mask 1701 and second mask 1702. For example, a first etch process can be used to remove first mask 1701 and second insulating layer 901, and a second etch process might be used to remove third insulating layer 1301 and a third etch process might be used to remove second mask 1702 and any remaining first mask 1701. Removal of the second insulating layer 901, third insulating layer 1301 and first mask 1701 creates a trench 1801 and vias 1802, 1803.

Trench 1801 extends in a second direction that is different from the first direction of the conductive lines 103. In the embodiment shown, the conductive lines 103 extend along the x-axis and the trench 1801 extends along the y-axis. In some embodiments, the second direction is at an angle to the first direction in the range of about 30° to about 150°, or in the range of about 50° to about 130°, or in the range of about 70° to about 110°, or in the range of about 80° to about 100°, or in the range of about 85° to about 95°, or in the range of about 87° to about 93°, or in the range of about 89° to about 91°.

Figure 19A:
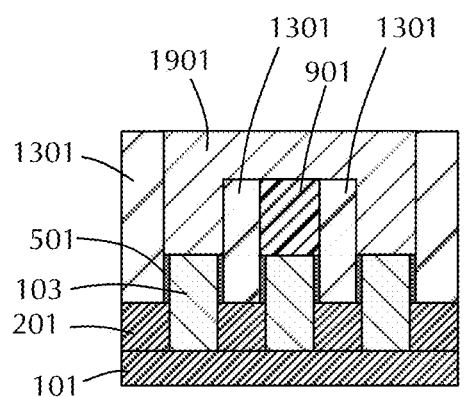
FIG. 19A is a side cross-sectional view of the electronic device structure after filling the vias and trench with a second conductive material according to some embodiments.
Figure 19B:
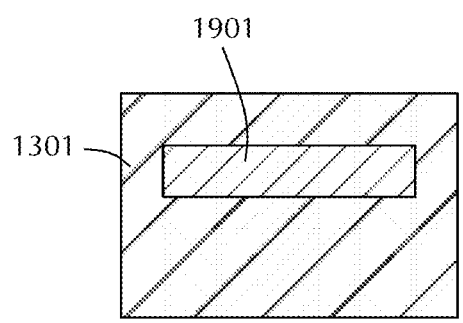
FIG. 19B is a top view of the electronic device structure shown in FIG. 19A.

FIGS. 19A and 19B illustrate the electronic device structure of FIGS. 18A and 18B, respectively, after deposition of second conductive material to form a second conductive line 1901 in the vias 1802, 1803 and trench 1801 according to some embodiments. The second conductive line 1901 can be any suitable metal and can be deposited by any suitable deposition technique. The second conductive line 1901 extends in the second direction which is different than the first direction of the conductive line 103, as described herein.

Figure 20:
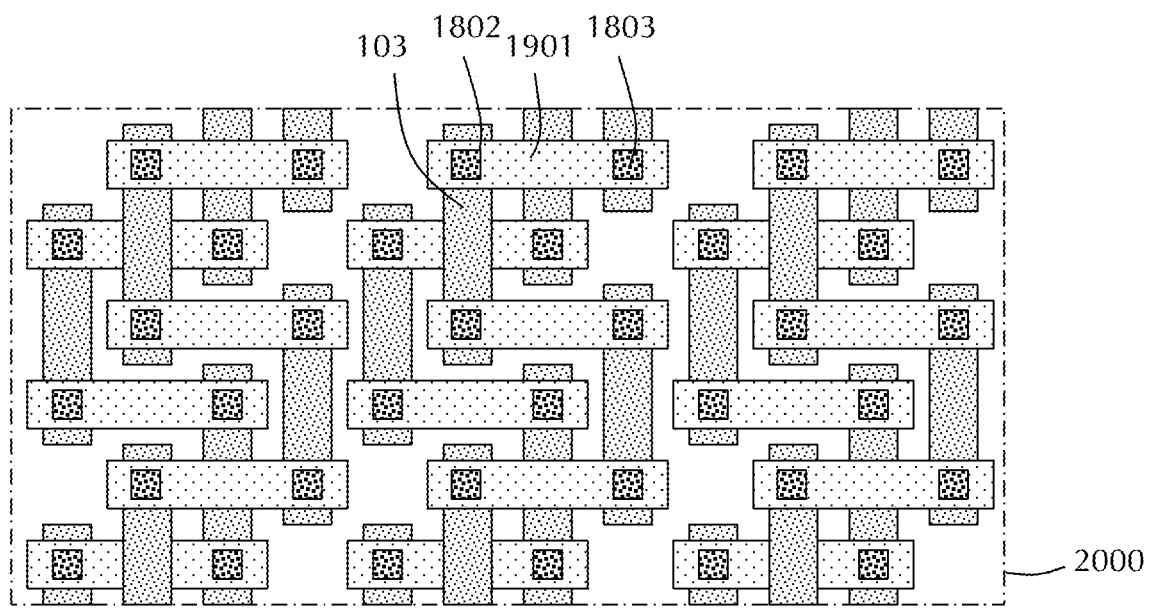
FIG. 20 shows a portion of an electronic device with fully self-aligned vias in accordance with one or more embodiment of the disclosure.

FIG. 20 shows a portion of a device 2000 with the fully self-aligned vias in a nested structure. The first conductive lines 103 extend vertically in the diagram and the second conductive lines 1901 extend horizontally on the page. Vias 1802, 1803 are illustrated where the connections between the first conductive lines 103 and the second conductive lines 1901 occur. The packing and arrangement of the conductive lines and vias can be tighter (i.e., higher density) or looser (i.e., lower density) than the embodiment illustrated.

Figure 21:
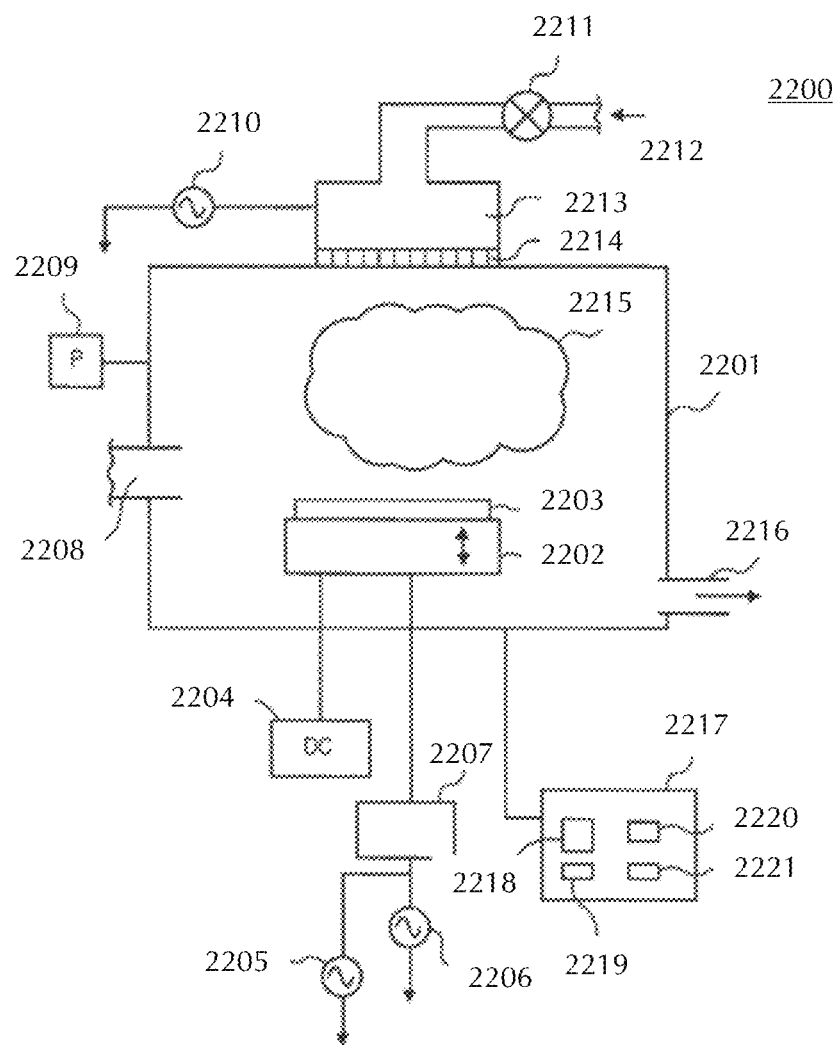
FIG. 21 shows a block diagram of a system in accordance with one or more embodiment of the disclosure.

FIG. 21 shows a block diagram of a plasma system to perform at least some of the operations to provide a fully self-aligned via according to some embodiments. As shown in FIG. 21, system 2200 has a processing chamber 2201. A movable pedestal 2202 to hold an electronic device structure 2203 is placed in processing chamber 2201. Pedestal 2202 comprises an electrostatic chuck ("ESC"), a DC electrode embedded into the ESC, and a cooling/heating base. In an embodiment, pedestal 2202 acts as a moving cathode. In an embodiment, the ESC comprises an $Al_2O_3$ material, $Y_2O_3$, or other ceramic materials known to one of ordinary skill of electronic device manufacturing. A DC power supply 2204 is connected to the DC electrode of the pedestal 2202.

As shown in FIG. 21, an electronic device structure 2203 is loaded through an opening 2208 and placed on the pedestal 2202. The electronic device structure 2203 represents one of the electronic device structures described above. System 2200 comprises an inlet to input one or more process gases 2212 through a mass flow controller 2211 to a plasma source 2213. A plasma source 2213 comprising a showerhead 2214 is coupled to the processing chamber 2201 to receive one or more gases 2212 to generate plasma. Plasma source 2213 is coupled to a RF source power 2210. Plasma source 2213 through showerhead 2214 generates a plasma 2215 in processing chamber 2201 from one or more process gases 2212 using a high frequency electric field. Plasma 2215 comprises plasma particles, such as ions, electrons, radicals or any combination thereof. In an embodiment, power source 2210 supplies power from about 50 W to about 3000 W at a frequency from about 400 kHz to about 162 MHz to generate plasma 2215.

A plasma bias power 2205 is coupled lo the pedestal 2202 (e.g., cathode) via a RF match 2207 to energize the plasma. In an embodiment. the plasma bias power 2205 provides a bias power that is not greater than 1000 W at a frequency between about 2 MHz to 60 MHz. and in a particular embodiment at about 13 MHz. A plasma bias power 2206 may also be provided. for example to provide another bias power that is not greater than 1000 W at a frequency from about 400 kHz to about 60 MHz, and in a particular embodiment, at about 60 MHz. Plasma bias power 2206 and bias power 2205 are connected lo RF match 2207 to provide a dual frequency bias power. In an embodiment. a total bias power applied to the pedestal 2202 is from about 10 W to about 3000 W.

As shown in FIG. 21, a pressure control system 2209 provides a pressure to processing chamber 2201. As shown in FIG. 21, chamber 2201 has one or more exhaust outlets 2216 to evacuate volatile products produced during processing in the chamber. In an embodiment, the plasma system 2200 is an inductively coupled plasma (ICP) system. In an embodiment, the plasma system 2200 is a capacitively coupled plasma (CCP) system.

A control system 2217 is coupled to the chamber 2201. The control system 2217 comprises a processor 2218, a temperature controller 2219 coupled to the processor 2218, a memory 2220 coupled to the processor 2218 and input/output devices 2221 coupled to the processor 2218 to form fully self-aligned via as described herein. The control system 2217 can also include one or more of circuits, non-transitory memory, transitory memory, electronic media or executable instruction sets as may be used to operate under various configurations.

In some embodiments, the control system 2217, or the processor 2218 within the control system 2217 includes one or more configurations (i.e., executable instruction sets) to process a substrate. The control system 2217 and/or processor 2218 may have one or more configurations to control actions or processes selected from: recessing the first insulating layers, depositing a liner on the recessed first insulating layers, forming a seed gapfill layer on the recessed first insulating layers and first conductive lines, planarizing the seed gapfill layer so that the top of the seed gapfill layer is substantially even with the top of the first insulating layers, forming pillars from the seed gapfill layer, depositing a second insulating layer in gaps between the pillars, selectively removing the pillars, forming a third insulating layer on the second insulating layer and in the gaps left after removing the pillars, forming an overburden of third insulating layer on the second insulating layer, removing the third insulating layer from the filled vias to form a via opening to the first conductive line and a trench. In some embodiments, the configuration controls recessing the first insulating lines such that the first insulating lines are recessed in the range of about 10 nm to about 50 nm. In some embodiments, the control system 2217 and/or processor 2218 includes a configuration to deposit a second conductive material into the via opening and trench.

The control system 2217 is configured to perform at least some of the methods as described herein and may be either software or hardware or a combination of both. The plasma system 2200 may be any type of high performance processing plasma systems known in the art, such as but not limited to an etcher, a cleaner, a furnace, or any other plasma system to manufacture electronic devices.

The control system 2217 can be any suitable controller and may include a processor 2218 coupled with a memory 2220 configured to enable the processing of one or more electronic device structures. For example, the processor 2218 may be configured with executable instructions stored in the memory 2220 to enable operations of pedestal 2202, the mass flow controller 2211, the plasma source 2213 and/or the pressure control system 2209 as described herein.

In one or more embodiments, the processor 2218 may be one of any form of general-purpose computer processors that can be used in an industrial setting for controlling various manufacturing equipment used in semiconductor manufacturing. The memory 2220 may be in the form of a computer-readable medium and may be one or more of readily available memory such as random access memory (RAM), read only memory (ROM), floppy disk, hard disk, or any other form of digital storage, local or remote. In one or more embodiments, support circuits (not shown) are coupled to the processor 2218 for supporting the processor 2218 in a conventional manner. These support circuits can include cache, power supplies, clock circuits, input/output circuitry and subsystems, and the like.

In one or more embodiments, process routines may generally be stored in the memory 2220 as a software routine that, when executed by the processor 2218, causes the processing platform 2200 to perform processes disclosed herein. The software routine may also be stored and/or executed by a second processor (not shown) that is remotely located from the hardware being controlled by the processor 2218. The software routine, when executed by the processor 2218 causes the control system 2217 to function as a specific purpose controller. When the control system 2217 includes a computer, the control system 2217 functions as a special purpose computer for controlling the processing platform 2200 to perform the processes disclosed herein.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "some embodiments," "certain embodiments," "one or more embodiments" or "an embodiment" means that a particular feature, structure, material, or characteristic described in connection with the embodiment is included in at least some embodiments of the disclosure. Thus, the appearances of the phrases such as "in one or more embodiments," "in certain embodiments," "in some embodiments" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method to provide a self-aligned via, the method comprising:
    forming a seed gapfill layer on recessed first insulating layers positioned between first conductive lines, the first conductive lines extending along a first direction;
    forming pillars from the seed gapfill layer, the pillars extending above the first conductive lines;
    depositing a second insulating layer in gaps between the pillars on the first conductive lines;
    removing the pillars to form gaps in the second insulating layer;
    depositing a third insulating layer in the gaps in the second insulating layer, onto the recessed first insulating layers and on the second insulating layer to form an overburden of third insulating layer on the second insulating layer; and
    selectively etching a portion of the overburden of the third insulating layer and some of the second insulating layer to expose the first conductive lines and form vias and a trench extending in a second direction different from the first direction.

2. The method of claim 1, wherein the first conductive lines comprise one or more of cobalt or copper.

3. The method of claim 1, further comprising providing a substrate with a plurality of first conductive lines between a plurality of first insulating layers which are substantially coplanar, and recessing the first insulating layers.

4. The method of claim 1, further comprising depositing a liner on the recessed first insulating layers and first conductive lines onto which the metal seed layer is formed.

5. The method of claim 4, wherein the liner is deposited conformally on the recessed first insulating layer and the first conductive lines and the liner is removed from a top of the first conductive lines after removing the pillars.

6. The method of claim 4, wherein a liner is deposited selectively on only the recessed first conductive lines.

7. The method of claim 4, wherein the liner comprises a nonconductive material.

8. The method of claim 7, wherein the nonconductive material is selected from SiN, AlN, or combinations thereof.

9. The method of claim 8, further comprising removing the liner from the top of the first conductive lines before depositing the second insulating layer so that the second insulating layer is in contact with the first conductive lines.

10. The method of claim 1, wherein the metal seed layer comprises tungsten.

11. The method of claim 10, wherein the pillars are formed by oxidizing the tungsten film to form tungsten oxide.

12. The method of claim 1, wherein removing the pillars comprises exposure to a metal halide or wet etching with a solution of HF and $HNO_3$ or a solution of $NH_4OH$ and $H_2O_2$.

13. The method of claim 1, further comprising depositing a second conductive line into the via openings and the trench, the second conductive line in contact with the first conductive line.

14. The method of claim 13, wherein the second direction crosses the first direction at an angle in the range of about 30° to about 150°.

15. A method to provide an electronic device with a self-aligned via, the method comprising:
    recessing first insulating layers comprising silicon dioxide to form a substrate with recessed first insulating layers with first conductive lines comprising copper or cobalt, the first conductive lines extending along a first direction;
    depositing a liner on the recessed first insulating layers and sidewalls of the first conductive lines, the conformal liner comprising TiN;
    forming a seed gapfill layer comprising tungsten on the liner on the recessed first insulating layers so that a top of the seed gapfill layer is substantially even with a top of the first conductive lines;
    oxidizing the seed gapfill layer to form pillars of tungsten oxide on the recessed first insulating layers so that there is a gap between adjacent pillars over the first conductive lines;
    depositing a second insulating layer in the gap over the first conductive lines so that a top of the second insulating layer is substantially even with a top of the pillars;
    selectively removing the pillars and leaving a gap between adjacent second insulating layers;
    depositing a third insulating layer in the gaps between adjacent second insulating layers to form an overburden on the top of the second insulating layers;
    selectively removing a portion of the third insulating layer to expose the top surface of at least some second insulating layers;
    selectively removing some of the second insulating layers to form a via to the first conductive lines and a trench extending in a second direction different than the first direction; and
    depositing a second conductive line into the via and trench to form second conductive lines extending in a second direction different from the first direction, the second direction crossing the first direction at an angle in the range of about 30° to about 150°.

16. The method of claim 15, wherein depositing the second insulating layer in the gap over the first conductive lines comprises forming an overburden of the second insulating layer on the top of the first conductive lines and removing the overburden by planarization.

17. The method of claim 15, wherein depositing the third insulating layer to form an overburden comprises depositing the third insulating layer to form an initial overburden, removing the initial overburden and depositing additional third insulating layer to form an overburden of a predetermined thickness.

* * * * *

UNITED STATES PATENT AND TRADEMARK OFFICE
CERTIFICATE OF CORRECTION

PATENT NO.         : 10,600,688 B2
APPLICATION NO.    : 16/116181
DATED              : March 24, 2020
INVENTOR(S)        : Ying Zhang et al.

Page 1 of 1

It is certified that error appears in the above-identified patent and that said Letters Patent is hereby corrected as shown below:

In the Specification

In Column 10, Line 23, replace "AlO" with "$Al_2O_3$".

Signed and Sealed this
Second Day of June, 2020

Andrei Iancu
*Director of the United States Patent and Trademark Office*